US012632706B2

(12) United States Patent
Wu et al.

(10) Patent No.: US 12,632,706 B2
(45) Date of Patent: May 19, 2026

(54) LIGHT SOURCE OPTIMIZATION APPARATUS AND LIGHT SOURCE OPTIMIZATION METHOD

(71) Applicant: Winbond Electronics Corp., Taichung City (TW)

(72) Inventors: Tung-Yu Wu, Taichung City (TW); Chun-Yen Liao, Taichung City (TW); Tsung-Wei Lin, Taichung City (TW); Chun-Sheng Wu, Taichung City (TW); Chao-Yi Huang, Taichung City (TW); Yu Ming Li, Taichung City (TW); Hung-Fei Kuo, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 1013 days.

(21) Appl. No.: 17/715,947

(22) Filed: Apr. 7, 2022

(65) Prior Publication Data

US 2023/0325641 A1     Oct. 12, 2023

(51) Int. Cl.
*G06N 3/047*     (2023.01)
*G03F 7/00*     (2006.01)

(52) U.S. Cl.
CPC ......... *G06N 3/047* (2023.01); *G03F 7/70491* (2013.01)

(58) Field of Classification Search
CPC ........................... G06N 3/047; G03F 7/70491
See application file for complete search history.

(56) References Cited

U.S. PATENT DOCUMENTS

| 11,250,199 | B1 * | 2/2022 | Pillai | G06N 3/045 |
| 2008/0174756 | A1 * | 7/2008 | Granik | G03F 7/70441 |
| | | | | 716/54 |
| 2011/0206270 | A1 * | 8/2011 | Ishii | G03F 7/709 |
| | | | | 382/144 |
| 2012/0133915 | A1 | 5/2012 | Matsuyama et al. | |

(Continued)

FOREIGN PATENT DOCUMENTS

| CN | 109102517 A | * 12/2018 | .............. G06T 7/181 |
| CN | 113902924 | 1/2022 | |

OTHER PUBLICATIONS

Z. Tu, Q. Wang and Y. Shen, "Optimal Mobile Agent Routing for Data Fusion in Distributed Sensor Networks Using Improved Ant Colony Algorithm," 2008 IEEE Instrumentation and Measurement Technology Conference, Victoria, BC, Canada, 2008, pp. 155-159 , doi: 10.1109/IMTC.2008.4547022. (Year: 2008).*

(Continued)

*Primary Examiner* — Kamran Afshar
(74) *Attorney, Agent, or Firm* — JCIPRNET

(57) ABSTRACT

The invention provides a light source optimization apparatus including a storage apparatus and a processor. The storage apparatus stores a plurality of modules. The processor is coupled to the storage apparatus and configured to execute the plurality of modules. The plurality of modules include a critical pattern module and a light source optimization module. The critical pattern module retrieves critical pattern data. The light source optimization module executes an ant colony optimization (ACO) algorithm according to a preset parameter to adjust an initial light source image to generate an output light source image, and the initial light source image corresponds to the critical pattern data.

18 Claims, 5 Drawing Sheets

Retrieve critical pattern data — S601

Encode the critical pattern data as feature data — S603

Generate feature summary data by performing a weighting operation on the feature data according to a plurality of weighting coefficients — S605

Decode the feature summary data to obtain an initial light source image — S607

Execute an ant colony optimization algorithm according to a preset parameter to adjust the initial light source image to generate an output light source image, wherein the initial light source image corresponds to the critical pattern data — S609

(56)                    References Cited

U.S. PATENT DOCUMENTS

2014/0118561  A1       5/2014  La Lumondiere et al.
2018/0282721  A1*    10/2018  Cox  ....................... G16B 35/10
2018/0357514  A1*    12/2018  Zisimopoulos  ...... G06V 10/764
2021/0048753  A1       2/2021  Zhang et al.
2021/0366085  A1*    11/2021  Shibasaki  ................. G06T 7/70
2022/0092426  A1*      3/2022  Pang  ..................... G06N 3/084

OTHER PUBLICATIONS

Ma, X., Zhao, Q., Zhang, H., Wang, Z., & Arce, G. R. (2018). Model-driven convolution neural network for inverse lithography. Optics express, 26(25), 32565-32584. (Year: 2018).*
"Office Action of China Counterpart Application No. 202210319439. 5", issued on Apr. 1, 2026, p. 1-p. 8.

* cited by examiner

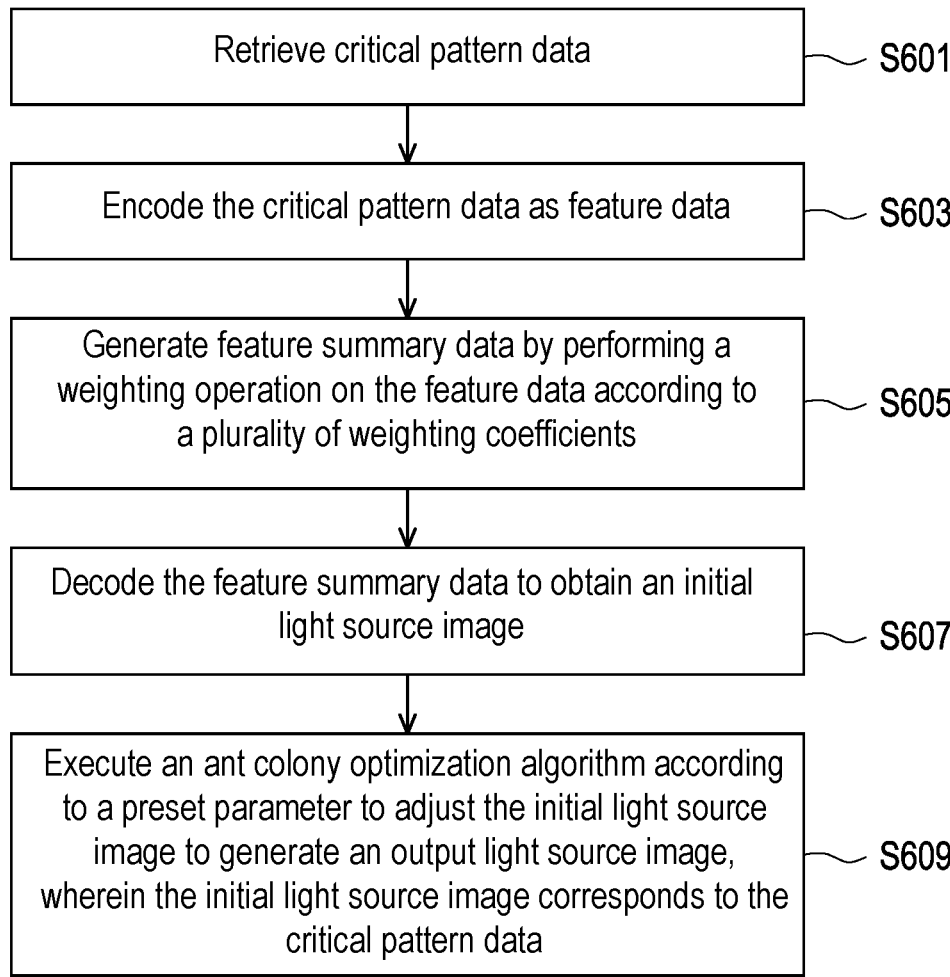

| Retrieve critical pattern data | ~ S601 |

| Encode the critical pattern data as feature data | ~ S603 |

| Generate feature summary data by performing a weighting operation on the feature data according to a plurality of weighting coefficients | ~ S605 |

| Decode the feature summary data to obtain an initial light source image | ~ S607 |

| Execute an ant colony optimization algorithm according to a preset parameter to adjust the initial light source image to generate an output light source image, wherein the initial light source image corresponds to the critical pattern data | ~ S609 |

FIG. 6

LIGHT SOURCE OPTIMIZATION APPARATUS AND LIGHT SOURCE OPTIMIZATION METHOD

BACKGROUND OF THE INVENTION

Field of the Invention

The invention relates to a semiconductor process optimization technique, and in particular, to a light source optimization apparatus and a light source optimization method.

Description of Related Art

With the rapid development of semiconductor process techniques, the size of circuit elements is continuously reduced, and the number of functional elements per integrated circuit continues to increase, following the trend of "Moore's law". The prior art uses lithography, which uses illumination from a deep ultraviolet laser light source to project a mask pattern onto a substrate to form individual circuit features of tiny dimensions, to fabricate critical layers of integrated circuits.

Lithography may be used for integrated circuit fabrication. The mask contains circuit patterns corresponding to individual layers of the integrated circuit. These patterns may be imaged onto a substrate coated with a layer of radiation-sensitive material by lithography. The light patterns are exposed on the semiconductor wafer substrate to form patterns to define the functional elements of the semiconductor device.

FIG. 1 is a schematic diagram of a conventional exposure machine illumination light source forming a pattern on a wafer via a mask. An exposure machine illumination light source L exposes a light source image on a mask M, and forms a pattern on a wafer W via the mask M. As the size of circuit elements is increasingly getting smaller, the line width of the pattern formed on the wafer W is also reduced, so that the sensitivity of the pattern to the exposure machine illumination light source L is ever increasing. Conventional light source images are usually circular, annular, quasar, or dipole. However, using conventional light source images requires a long period of trial and error and multiple tests to determine a better light source image. Moreover, conventional light source images are limited in shape and may not fully meet the requirements of the pattern specification.

Therefore, in order to achieve the best balance between more precise pattern resolution and light source images, it is necessary to optimize and adjust suitable light sources for light source images and patterns in the existing lithography techniques to obtain high-precision light source images.

SUMMARY OF THE INVENTION

Accordingly, the invention provides a light source optimization apparatus and a light source optimization method that may obtain a high-precision light source image.

An embodiment of the invention provides a light source optimization apparatus, including: a storage apparatus storing a plurality of modules; and a processor coupled to the storage apparatus and configured to execute the plurality of modules, wherein the plurality of modules include: a critical pattern module retrieving critical pattern data; and a light source optimization module executing an ant colony optimization (ACO) algorithm according to a preset parameter to adjust an initial light source image to generate an output light source image, wherein the initial light source image corresponds to the critical pattern data.

An embodiment of the invention provides a light source optimization method includes: retrieving critical pattern data; and executing an ACO algorithm according to a preset parameter to adjust an initial light source image to generate an output light source image, wherein the initial light source image corresponds to the critical pattern data.

Based on the above, in the light source optimization apparatus and the light source optimization method provided by the embodiments of the invention, the light source optimization module executes the ACO algorithm according to the preset parameter to adjust the initial light source image to generate the output light source image. In an embodiment of the invention, after the initial light source image is generated, the output light source image is further generated by readjusting the initial light source image according to the quality of the critical patterns. Thereby, the embodiments of the invention may optimize and adjust a suitable light source to obtain a high-precision light source image.

BRIEF DESCRIPTION OF THE DRAWINGS

FIG. 6 is a flowchart of a light source optimization method according to an embodiment of the invention.

DESCRIPTION OF THE EMBODIMENTS

Figure 1:
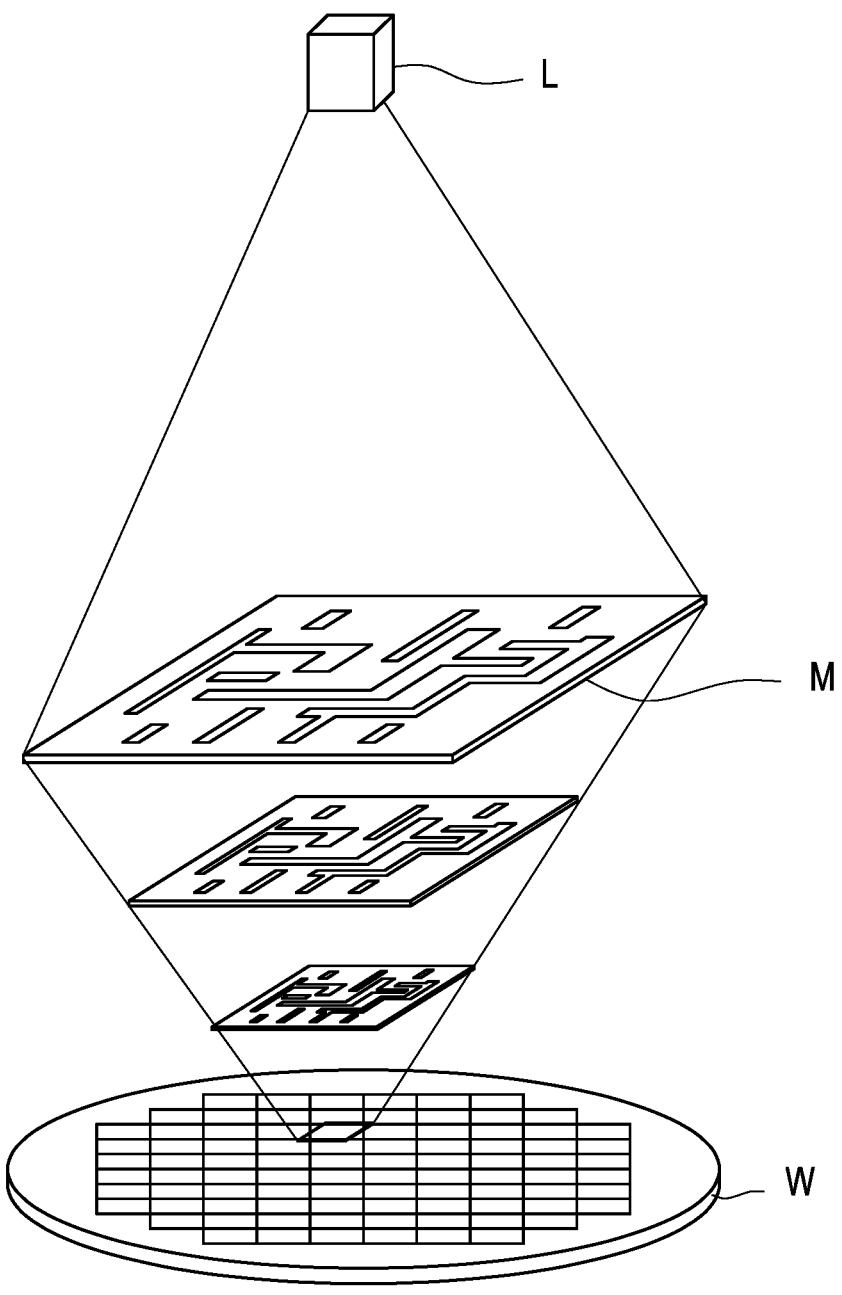
FIG. 1 is a schematic diagram of a conventional exposure machine illumination light source forming a pattern on a wafer via a mask.
Figure 2:
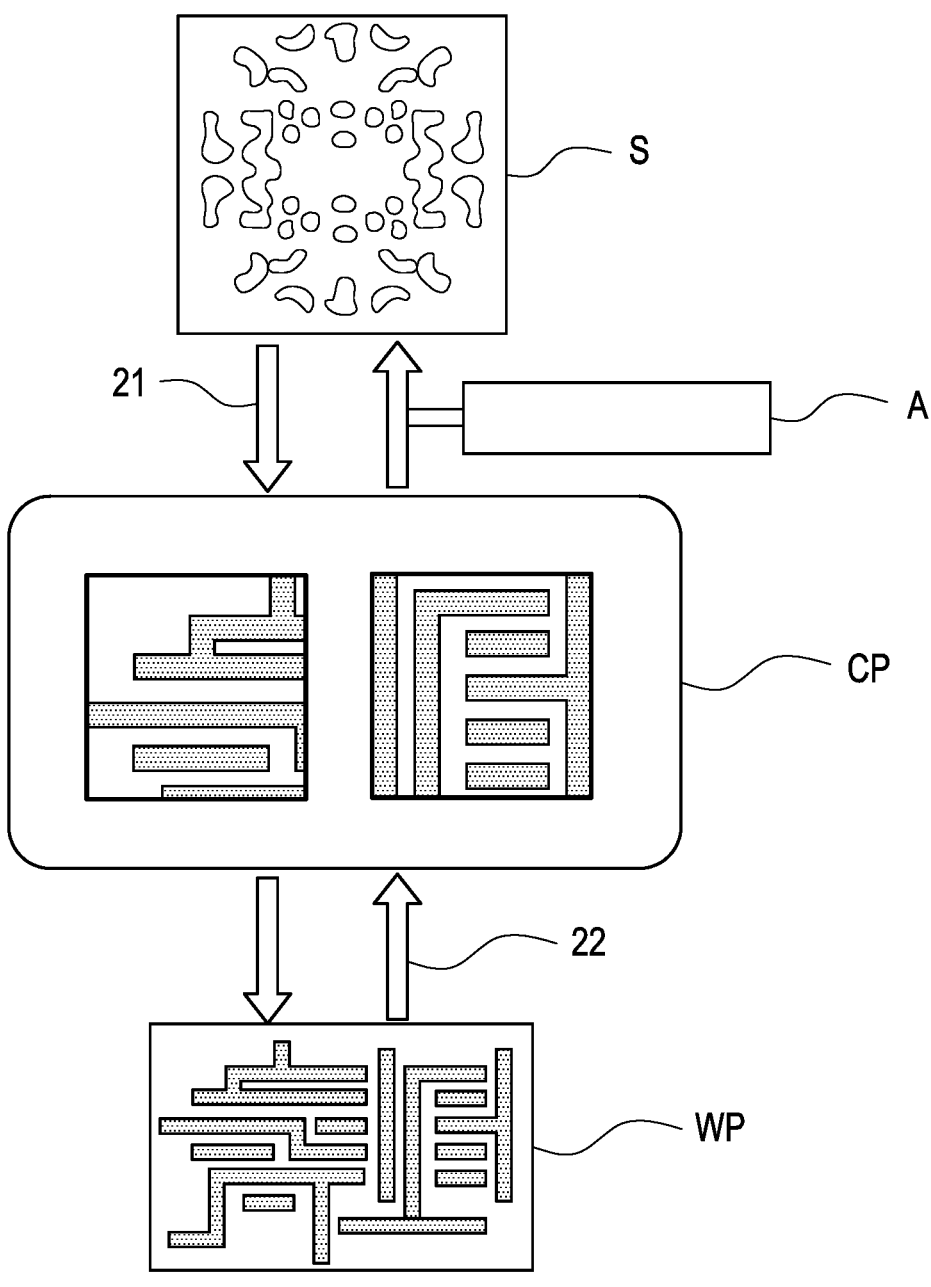
FIG. 2 is a schematic diagram of adjusting a light source image according to a critical pattern in an embodiment of the invention.

Referring to FIG. 2, a light source image S undergoes a verification step 21 to verify the results presented by a plurality of critical patterns CP on a wafer pattern WP. Next, the feedback step 22 is performed according to the quality of the wafer pattern WP, and the light source image S is adjusted by an optimization algorithm A according to the plurality of critical patterns CP. Due to the influence of the light source image S on the wafer pattern WP, when the line width of the wafer pattern WP is smaller, the sensitivity to the light source image S is higher.

Without the optimization algorithm A to adjust the light source image S, using the conventional method of exposure and capture requires a long period of time and multiple tests to determine a better light source image S. In an embodiment of the invention, the light source image S with high precision may be obtained by adjusting the light source image S according to the plurality of critical patterns CP via the optimization algorithm A.

Specifically, the critical patterns CP may be the portion of the wafer pattern WP that is highly sensitive to the light source image S or the portion of the wafer pattern WP having complex patterns and may cause process risks, such as the portion of the pattern showing bridges and necks.

In the verification step 21 and the feedback step 22, the critical patterns CP may be obtained from the pre-collected or simulated wafer pattern WP, and the critical patterns CP may be used as the basis for evaluating the quality of the light source image S. In an embodiment, in the feedback step 22, the difference between the wafer pattern WP formed by the light source image S and a target pattern may be obtained, and the difference is also called edge placement error (EPE). The target pattern may be determined by the critical patterns CP. The optimization algorithm A then adjusts the light source image S according to the difference.

In an embodiment, the optimization algorithm A is an ant colony optimization (ACO) algorithm.

In an embodiment, the optimization algorithm A includes a deep learning (DL) model and an ACO algorithm.

In an embodiment, the optimization algorithm A includes a DL model, a feature weighting mechanism, and an ACO algorithm.

Figure 3:
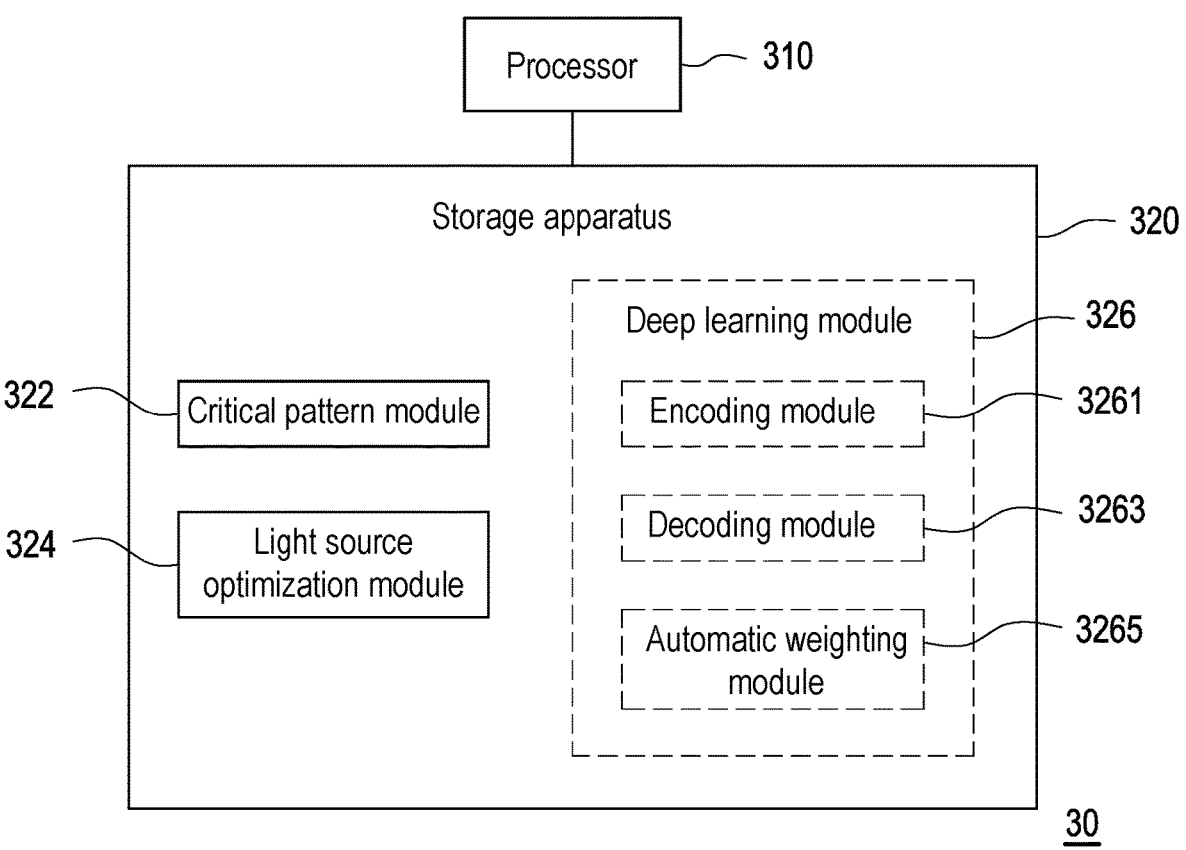
FIG. 3 is a block diagram of a light source optimization apparatus according to an embodiment of the invention.

Referring to FIG. 3, a light source optimization apparatus 30 includes a processor 310 and a storage apparatus 320. The processor 310 is coupled to the storage apparatus 320. The storage apparatus 320 stores a plurality of modules. The processor 310 is configured to execute a plurality of modules.

The processor 310 is, for example, a central processing unit (CPU), or other programmable general-purpose or special-purpose micro control units (MCU), microprocessors, digital signal processors (DSP), programmable controllers, application-specific integrated circuits (ASIC), graphics processing units (GPU), image signal processors (ISP), image processing units (IPU), arithmetic logic units (ALU), complex programmable logic devices (CPLD), field-programmable gate arrays (FPGA), or other similar components or a combination of the above components. The processor 310 may be coupled to the storage apparatus 320 and access and execute a plurality of modules and various applications stored in the storage apparatus 320.

The storage apparatus 320 is, for example, any type of fixed or removable random-access memory (RAM), read-only memory (ROM), or flash memory, hard disk drive (HDD), solid-state drive (SSD), or similar elements or a combination of the above elements to store a plurality of modules or various applications that may be executed by the processor 310. In the present embodiment, the storage apparatus 320 may store a plurality of modules including a critical pattern module 322, a light source optimization module 324, and a DL module 326, for example, and the functions thereof are described later.

Figure 4:
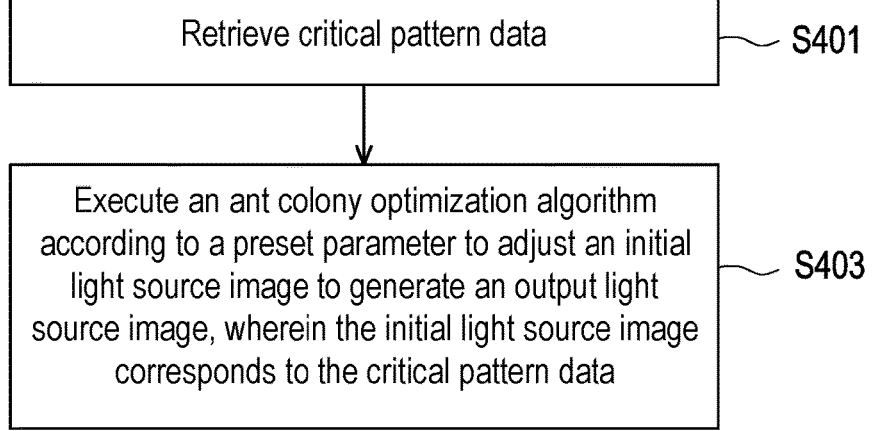
FIG. 4 is a flowchart of a light source optimization method according to an embodiment of the invention.

The light source optimization method shown in FIG. 4 is suitable for the light source optimization apparatus 30 of FIG. 3. Please refer to FIG. 3 and FIG. 4.

In an embodiment, the plurality of modules include the critical pattern module 322 and the light source optimization module 324.

In step S401, the critical pattern module 322 retrieves critical pattern data.

In step S403, the light source optimization module 324 executes an ACO algorithm according to a preset parameter to adjust an initial light source image to generate an output light source image, wherein the initial light source image corresponds to the critical pattern data.

In an embodiment, the plurality of modules stored in the storage apparatus 320 further include the DL module 326. The DL module 326 includes an encoding module 3261 and a decoding module 3263. The encoding module 3261 encodes the critical pattern data as feature data. The decoding module 3263 decodes the feature data to obtain an initial light source image. In an embodiment, the encoding module 3261 is a convolutional neural network (CNN) encoder. In an embodiment, the decoding module 3263 is a CNN decoder.

In an embodiment, the DL module 326 further includes an automatic weighting module 3265. The automatic weighting module 3265 performs a weighting operation on the feature data according to a plurality of weighting coefficients to generate feature summary data. The decoding module 3263 decodes the feature summary data to obtain an initial light source image.

Figure 5:
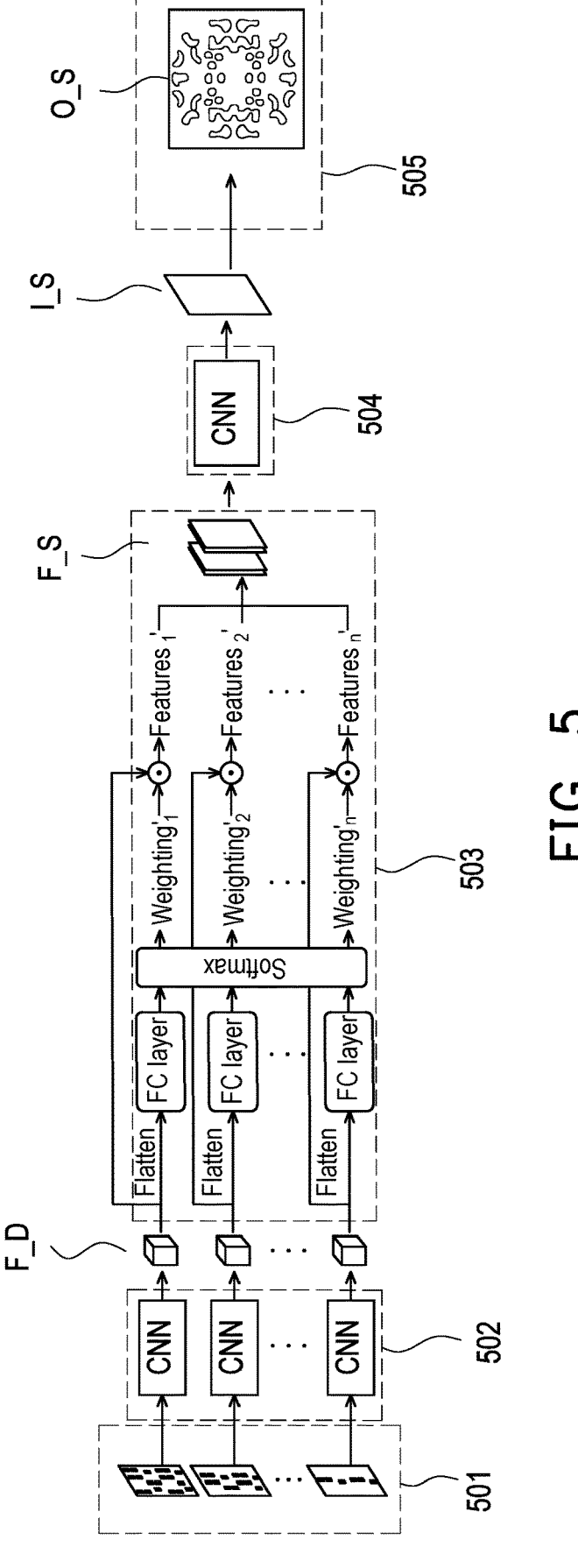
FIG. 5 is a schematic diagram of a light source optimization apparatus according to an embodiment of the invention.

Referring to FIG. 5, a light source optimization apparatus includes a critical pattern module 501, an encoding module 502, an automatic weighting module 503, a decoding module 504, and a light source optimization module 505. The encoding module 502, the automatic weighting module 503, and the decoding module 504 are also collectively referred to as a DL module.

The critical pattern module 501 retrieves critical pattern data. The critical pattern data includes a plurality of input images. The critical pattern module 501 inputs a plurality of input images into the encoding module 502 for encoding to generate feature data F_D. The encoding module 502 includes a plurality of encoders.

These encoders may be CNNs. The plurality of encoders respectively encode a plurality of input images to generate a plurality of eigenvectors of the feature data F_D.

The automatic weighting module 503 includes a plurality of fully connected (FC) layers and a softmax layer.

The automatic weighting module 503 respectively flattens the plurality of eigenvectors of the feature data F_D and then inputs them into the plurality of FC layers, and generates a plurality of weighting coefficients $Weighting'_1$, $Weighting'_2$, . . . , $Weighting'_n$ via the softmax layer. The automatic weighting module 503 performs a weighting operation on the plurality of eigenvectors of the feature data F_D according to the plurality of weighting coefficients $Weighting'_1$, $Weighting'_2$, . . . , $Weighting'_n$ to generate a plurality of weighted eigenvectors $Features'_1$, $Features'_2$, . . . , $Features'_n$. The automatic weighting module 503 combines the plurality of weighted eigenvectors $Features'_1$, $Features'_2$, . . . , $Features'_n$ into feature summary data F_S.

The decoding module 504 decodes the feature summary data F_S to obtain an initial light source image I_S. The decoding module 504 may be a CNN.

The light source optimization module 505 executes the ACO algorithm according to a preset parameter to adjust the initial light source image I_S to generate an output light source image O_S.

The light source optimization method shown in FIG. 6 is suitable for the light source optimization apparatus 30 of FIG. 3 or the light optimization apparatus of FIG. 5. The following takes the light source optimization apparatus 30 of FIG. 3 as an example. In step S601, the critical pattern module 322 retrieves critical pattern data. In step S603, the encoding module 3261 encodes the critical pattern data as feature data. In step S605, the automatic weighting module 3265 performs a weighting operation on the feature data according to a plurality of weighting coefficients to generate feature summary data. In step S607, the decoding module 3263 decodes the feature summary data to obtain an initial light source image. In step S609, the light source optimization module 324 executes an ACO algorithm according to a preset parameter to adjust the initial light source image to generate an output light source image, wherein the initial light source image corresponds to the critical pattern data.

It should be noted that, in an embodiment of the invention, the concept of the ACO algorithm is used to solve the issue of light source optimization. The ACO algorithm solves the optimization issue by building a path model according to the mechanism that ant colonies use to build and maintain a path to a desired food source. Ants randomly choose a path to a food source according to a probability distribution. On the selected path, the ants place chemicals called pheromones that cause other ants to choose which path to follow according to pheromone concentration. As more ants travel a path, the concentration of pheromones placed on that path is increased, thus allowing more ants to be attracted and follow the path to the food source and back. At the same time, the concentration of pheromones along the path is evaporated according to the decay rate. After several rounds, the longer and less frequently chosen paths are gradually eliminated, and the shorter and more frequently selected paths are left behind so that the ACO algorithm may converge to the solution of the optimization issue to be solved.

In an embodiment of the invention, the preset parameter of the light source optimization module 324 executing the ACO algorithm includes pheromone concentration, decay rate, probability distribution, and number of ants.

In an embodiment, the light source optimization module 324 determines the number of ants according to a dimension of the initial light source image. Specifically, the initial light source image may be, for example, an image with a dimension of d×d, and each pixel of the initial light source image may correspond to m values, wherein m is an integer. In an embodiment, the number of ants in the ACO algorithm is determined by a value of $\sqrt{d \times d \times m}$ and an approximate integer value of the square root thereof.

In an embodiment, the light source optimization module 324 performs a roulette wheel selection operation according to the preset parameter to generate a first light source image, and updates the probability distribution according to the first light source image.

In detail, the roulette wheel selection operation may be calculated by the following equation (1):

$$\tau^{\beta} \times P^{\alpha} \tag{1}$$

In equation (1), variable $\tau$ represents pheromone concentration, variable P represents probability distribution, and parameters $\alpha$ and $\beta$ are used to reflect the importance of the pheromone concentration and preference. Specifically, the initial light source image may be, for example, an image with a dimension of d×d, and each pixel may correspond to m values, so the variables $\tau$ and P are both of the dimension d×d×M. The calculation result of equation (1) produces the first light source image with d×d values, which is the solution of one ant in this round. The first light source image is normalized and used to update the probability distribution of this round.

In an embodiment, the light source optimization module 324 generates a plurality of second light source images in one round of the ACO algorithm, the light source optimization module 324 selects a plurality of third light source images according to the errors between the plurality of second light source images and a target light source image, and the light source optimization module 324 superimposes the plurality of third light source images and updates the probability distribution according to the superimposed light source images.

Specifically, referring to FIG. 2, in the stage of the feedback step 22, the light source optimization module 324 may obtain a plurality of errors between the second light source image and the target light source image. This error may be, for example, an edge placement error (EPE). The target light source image may be the critical patterns CP among the pre-collected or simulated wafer pattern WP. The light source optimization module 324 sorts the errors between the plurality of second light source images and the target light source image, and selects a K number of third light source images with the smallest error to update the probability distribution, wherein K is an integer.

In an embodiment, the light source optimization module 324 directly superimposes the selected K number of third light source images with the smallest error, and normalizes the superimposed light source images to update the probability distribution of this round.

In an embodiment, the light source optimization module 324 records the result with the smallest error in the previous round, and the light source optimization module 324 directly superimposes the result with the smallest error in the previous round and the selected K number of third light source images with the smallest error, and normalizes the superimposed light source images to update the probability distribution of this round.

Based on the above, in the light source optimization apparatus and the light source optimization method provided by the embodiments of the invention, the light source optimization module executes the ACO algorithm according to the preset parameter to adjust the initial light source image to generate the output light source image. After the initial light source image is generated, the initial light source image may be re-adjusted to generate the output light source image. Thereby, the embodiments of the invention may optimize and adjust a suitable light source to obtain a high-precision light source image. In an embodiment of the invention, the DL module may decode and encode to induce a sufficiently reliable initial light source image to be provided to the light source optimization module to run the ACO algorithm. In this way, the convergence speed of the ACO algorithm is further improved, and a high-precision light source image may be obtained in a short time. Moreover, in an embodiment of the invention, the DL module also introduces an automatic weighting module to emphasize the importance of individual critical patterns. According to the properties of the patterns, the suitable light source may be adjusted by automatic weighting operation. By combining the DL module with the ACO algorithm of the light source optimization module, an embodiment of the invention may obtain a high-precision light source more quickly, and effectively improve execution efficiency.

Although the invention has been described with reference to the above embodiments, it will be apparent to one of ordinary skill in the art that modifications to the described embodiments may be made without departing from the spirit of the disclosure. Accordingly, the scope of the disclosure is defined by the attached claims not by the above detailed descriptions.

What is claimed is:

1. A light source optimization apparatus, comprising:
   a storage apparatus storing a plurality of modules; and
   a processor coupled to the storage apparatus and configured to execute the plurality of modules, wherein the plurality of modules comprise:
   a critical pattern module retrieving critical pattern data; and
   a light source optimization module executing an ant colony optimization (ACO) algorithm according to a preset parameter to adjust an initial light source image to generate an output light source image, wherein the initial light source image corresponds to the critical pattern data, and the preset parameter includes a number of ants, wherein the processor is further configured to control the light source optimization module to calculate the number of ants based on a dimension of the initial light source image and m values that each pixel of the initial light source image corresponding to, wherein m is an integer.

2. The light source optimization apparatus of claim 1, wherein the plurality of modules further comprise:

a deep learning module, comprising:
  an encoding module encoding the critical pattern data as feature data; and
  a decoding module decoding the feature data to obtain the initial light source image.

3. The light source optimization apparatus of claim 2, wherein the encoding module is a convolutional neural network (CNN) encoder, and the decoding module is a CNN decoder.

4. The light source optimization apparatus of claim 2, wherein the deep learning module further comprises:

an automatic weighting module performing a weighting operation on the feature data according to a plurality of weighting coefficients to generate feature summary data, wherein
the decoding module decodes the feature summary data to obtain the initial light source image.

5. The light source optimization apparatus of claim 2, wherein the critical pattern data comprises a plurality of input images,
the encoding module comprises a plurality of encoders,
the plurality of encoders respectively encode the plurality of input images to generate a plurality of eigenvectors.

6. The light source optimization apparatus of claim 4, wherein the automatic weighting module comprises:
  a plurality of fully connected (FC) layers; and
  a softmax layer, wherein
    the automatic weighting module respectively flattens a plurality of eigenvectors and then inputs the plurality of FC layers and generates a plurality of weighting coefficients via the softmax layer,
    the automatic weighting module performs a weighting operation on the plurality of eigenvectors according to the plurality of weighting coefficients to generate the feature summary data.

7. The light source optimization apparatus of claim 1, wherein the preset parameter further comprises a pheromone concentration, a decay rate, and a probability distribution.

8. The light source optimization apparatus of claim 7, wherein the light source optimization module performs a roulette wheel selection operation according to the preset parameter to generate a first light source image, and updates the probability distribution according to the first light source image.

9. The light source optimization apparatus of claim 7, wherein the light source optimization module generates a plurality of second light source images in one round of the ACO algorithm, the light source optimization module selects a plurality of third light source images according to an error between the plurality of second light source images and a target light source image, the light source optimization module superimposes the plurality of third light source images and updates the probability distribution according to the superimposed light source images.

10. A light source optimization method, comprising:

retrieving critical pattern data; and executing an ant colony optimization (ACO) algorithm according to a preset parameter to adjust an initial light source image to generate an output light source image, wherein the initial light source image corresponds to the critical pattern data, and the preset parameter includes a number of ants;

wherein executing the ACO algorithm according to the preset parameter to adjust the initial light source image to generate the output light source image comprises:
  using a processor to calculate the number of ants based on a dimension of the initial light source image and m values that each pixel of the initial light source image corresponding to, wherein m is an integer.

11. The light source optimization method of claim 10, further comprising:

encoding the critical pattern data as feature data; and decoding the feature data to obtain the initial light source image.

12. The light source optimization method of claim 11, further comprising:

performing a weighting operation on the feature data according to a plurality of weighting coefficients to generate feature summary data.

13. The light source optimization method of claim 12, wherein the step of decoding the feature data to obtain the initial light source image comprises:

decoding the feature summary data to obtain the initial light source image.

14. The light source optimization method of claim 11, wherein the critical pattern data comprises a plurality of input images, and the step of encoding the critical pattern data as the feature data comprises:

encoding the plurality of input images respectively to generate a plurality of eigenvectors.

15. The light source optimization method of claim 12, wherein performing the weighting operation on the feature data according to the plurality of weighting coefficients to generate the feature summary data comprises:

flattening a plurality of eigenvectors respectively and then inputting a plurality of FC layers and generating the plurality of weighting coefficients via a softmax layer, and performing the weighting operation on the plurality of eigenvectors according to the plurality of weighting coefficients to generate the feature summary data.

16. The light source optimization method of claim 10, wherein the preset parameter further comprises a pheromone concentration, a decay rate, and a probability distribution.

17. The light source optimization method of claim 16, wherein executing the ACO algorithm according to the preset parameter to adjust the initial light source image to generate the output light source image further comprises:

performing a roulette wheel selection operation according to the preset parameter to generate a first light source image, and updating the probability distribution according to the first light source image.

18. The light source optimization method of claim 16, wherein executing the ACO algorithm according to the preset parameter to adjust the initial light source image to generate the output light source image further comprises:

generating a plurality of second light source images in one round of the ACO algorithm;

selecting a plurality of third light source images according to an error between the plurality of second light source images and a target light source image; and superimposing the plurality of third light source images and updating the probability distribution according to the superimposed light source images.

\* \* \* \* \*